(12) United States Patent
Chen et al.

(10) Patent No.: US 8,134,823 B2
(45) Date of Patent: Mar. 13, 2012

(54) STACKED CAPACITOR STRUCTURE AND MANUFACTURING METHOD THEREOF

(75) Inventors: Wen-Hwa Chen, Hsinchu (TW);
Hsien-Chie Cheng, Hsinchu (TW);
Yun-Chiao Chen, Taichung County (TW); Su-Tsai Lu, Miaoli County (TW)

(73) Assignee: Industrial Technology Research Institute, Hsinchu (TW)

( * ) Notice: Subject to any disclaimer, the term of this patent is extended or adjusted under 35 U.S.C. 154(b) by 488 days.

(21) Appl. No.: 12/366,618

(22) Filed: Feb. 5, 2009

(65) Prior Publication Data

US 2009/0257169 A1   Oct. 15, 2009

(30) Foreign Application Priority Data

Apr. 9, 2008   (TW) ................................ 97112836 A

(51) Int. Cl.
*H01G 4/00* (2006.01)
(52) U.S. Cl. ............... 361/301.4; 361/306.1; 361/306.3; 361/320; 361/321.2
(58) Field of Classification Search .................. 361/301, 361/306.1, 306.3, 321, 321.2
See application file for complete search history.

(56) References Cited

U.S. PATENT DOCUMENTS

| | | | |
|---|---|---|---|
| 7,126,180 B2 | 10/2006 | Park | |
| 7,247,537 B2 | 7/2007 | Park | |
| 7,655,968 B2 * | 2/2010 | Manning | 257/302 |
| 2004/0080051 A1 | 4/2004 | Kawai | |
| 2005/0040448 A1 | 2/2005 | Park | |
| 2005/0161720 A1 | 7/2005 | Park | |
| 2005/0253179 A1 | 11/2005 | Park | |
| 2006/0211178 A1 | 9/2006 | Kim et al. | |

OTHER PUBLICATIONS

"Office Action of Taiwan Counterpart Application", issued on Sep. 23, 2011, p. 1-p. 5, in which the listed reference was cited.

\* cited by examiner

*Primary Examiner* — Nguyen T Ha
*Assistant Examiner* — Hung Dang
(74) *Attorney, Agent, or Firm* — Jianq Chyun IP Office

(57) ABSTRACT

In order to avoid the capacitors in a stacked capacitor structure suiting a miniaturization process from collapsing to cause a short-circuit, separated reinforced structures are used and disposed at the outer-sidewalls of the capacitor, which not only reduces the space occupied by the reinforced structure to increase the surface areas of the upper electrode and the lower electrode of the capacitor, but also allows the capacitor to be deflected but collapse-proof and there are more spaces between the capacitors, so as to solve the filling difficulty problem due to a too small filling space in a successive process of depositing conductive material into the filling space.

7 Claims, 10 Drawing Sheets

STACKED CAPACITOR STRUCTURE AND MANUFACTURING METHOD THEREOF

CROSS-REFERENCE TO RELATED APPLICATION

This application claims the priority benefit of Taiwan application serial no. 97112836, filed Apr. 9, 2008. The entirety of the above-mentioned patent application is hereby incorporated by reference herein and made a part of specification.

BACKGROUND OF THE INVENTION

1. Field of the Invention

The present invention generally relates to a semiconductor device and the manufacturing method thereof, and more particularly, to a stacked capacitor structure and the manufacturing method thereof.

2. Description of Related Art

A dynamic random access memory (DRAM) is an integrate circuit device (IC device) broadly employed in various applications. Along with the developments of industries, a demand on a DRAM with a larger storage capacity is increasing. The memory unit in a DRAM is composed of metal oxide semiconductor transistors (MOS transistors) and capacitors electrically connected to each other. The capacitor herein is mainly used to store charges representing the data to be stored, and high capacitance is the key to prevent the stored data from likely being lost. The way to increase the charge-storing capacity of a capacitor is to increase the dielectric coefficient of the dielectric material and reduce the thickness of the dielectric material, plus increasing the surface area of the capacitor. However, in the movement of the semiconductor technology towards sub-micron and deep sub-micron manufacturing level, the traditional capacitor is out of date for the semiconductor industry today. Therefore, the relevant developers are investigating a new dielectric material with a higher dielectric coefficient and a capacitor with a larger surface area so as to increase the capacitance of the capacitor.

In order to further advance the integration of a DRAM, a miniaturization process is absolutely required, where the section area per unit of capacitance and the space between the two electrodes of capacitor are made less and less. In such a limited space, a capacitor is able to provide an adequate capacitance to remain a satisfied signal intensity. Accordingly, the DRAM design needs to focus on the capacitor structure and the layout closely affecting the capacitance thereof. In addition, the DRAM process needs to be simplified so as to increase the production yield and reduce the cost for the DRAM manufacturer.

A conventional planar type capacitor is implemented by a two-dimension (2-D) layout, which occupies a considerable area of the semiconductor substrate for storing charges and thus unsuitable for a highly-integrated design. In contrast, a highly-integrated DRAM is implemented by employing three-dimension (3-D) capacitors, such as stacked capacitors or trench capacitors. In fact, for a memory device with higher integration, the conventional simple 3-D capacitor structure becomes even ineffective; and accordingly, a new design direction which focuses on increasing the surface area of the capacitors employed by a DRAM within a limited substrate area was proposed.

In addition, to effectively increase capacitance, it is preferred to adopt a cylindrical capacitor with a larger total surface area of the inner-and-outer sidewalls and give up the traditional cup-capacitor; although the cup-shape capacitor is more stable. However, the above-mentioned capacitor structure has a large aspect ratio of height over width for obtaining a large surface area, which makes the capacitor weaker in strength and structural instability, and the unstable structure increases the risk of collapse. When the capacitor is collapsed, a twin-bit failure occurs, which can be encountered, for example, in a 90 nm process. In the 90 nm process, a twin-bit failure occurs probably due to the unstable capacitor structure. There are two solutions for the above-mentioned problem: improving the space design of the capacitor structure in active manner or adding supporting structures between the capacitors in the manufacturing process to prevent the capacitors from collapse in passive manner.

A number of US patents involve the above-mentioned supporting structures. The U.S. Pat. No. 7,126,180 provides such a design that a ring-shape/bowl-shape stabling member is disposed at the outer-side of a capacitor, having a upper-wide and lower-narrow figure and fixed near the top portion of the lower electrode of the capacitor, so that the employed stabling members between the capacitors are connected to each other. The US patent application No. 20050161720 provides a solution that a stabling member having a protruding structure is disposed outside the main capacitor structure, and the stabling member with the adjacent connecting member together forms an H-shape layout. The US patent application No. 20050253179 provides a solution that a ring-shape stabling member is embedded in a ring-shape trench and perpendicular to the lower electrode plate of a capacitor. The U.S. Pat. No. 7,247,537 provides a solution that stabling members are respectively located near the top of the lower electrode of a capacitor, and connected to each other. The US patent application No. 20050040448 provides a solution structure that the upper portion of an employed stabling member is inwardly bent. The US patent application No. 20060211178 provides a solution that the employed stabling member is located around the round disc of the lower electrode of a capacitor and connecting members are employed between the lower electrodes.

SUMMARY OF THE INVENTION

The present invention is directed to a stacked capacitor structure and the manufacturing method thereof.

The present invention provides a stacked capacitor structure, which includes a lower electrode, a dielectric layer and an upper electrode. The dielectric layer covers the lower electrode and the upper electrode covers the dielectric layer. In addition, the reinforced structure is disposed at the top of the outer-sidewall of the lower electrode and consists of a plurality of separated members.

The present invention provides a method for manufacturing a stacked capacitor structure, which includes the following steps. First, a mold layer and a hard mask layer are formed on a substrate. Next, the hard mask layer is etched and a reinforced structure in the hard mask layer is formed, wherein the reinforced structure consists of a plurality of separated members. Next, an opening in the mold layer is formed, wherein the bottom of the opening exposes a conductive portion on the surface of the substrate. The hard mask layer is removed and the opening is etched. Next, a lower electrode is formed at the inner-sidewall of the opening and on the conductive portion. The mold layer is removed. Next, a dielectric layer is formed to cover the lower electrode and the reinforced structure. Next, an upper electrode is formed to cover the dielectric layer.

Since the present invention adopts a separated reinforced structure without connecting members; and therefore, the space occupied by the reinforced structure can be reduced to thereby increase the surface area of the capacitor.

BRIEF DESCRIPTION OF THE DRAWINGS

Other objectives, features and advantages of the present invention will be further understood from the further technological features disclosed by the embodiments of the present invention wherein there are shown and described preferred embodiments of this invention, simply by way of illustration of modes best suited to carry out the invention.

FIG. 3 is a diagram showing a 3-D diagram showing lower electrodes and reinforced structures of the present invention.

DESCRIPTION OF THE EMBODIMENTS

Figure 1A:
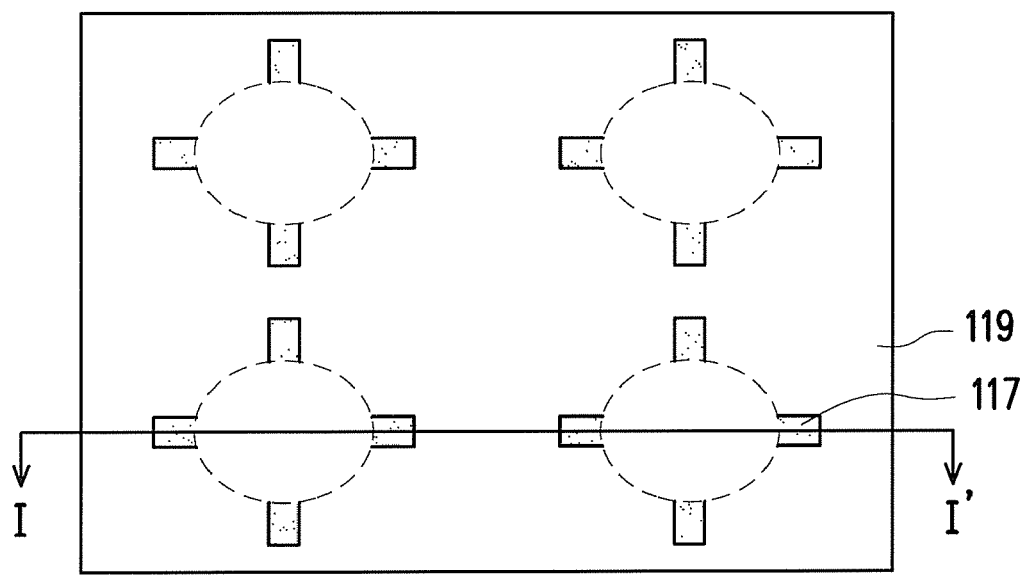
FIGS. 1A-1E are top-view diagrams showing a stacked capacitor structure and the flow of the prior fabrication stage thereof according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A-1E are top-view diagrams showing a stacked capacitor structure and the flow of the prior fabrication stage thereof according to an embodiment of the present invention and FIGS. 2A-2E are cross-section diagrams of the stacked capacitor structure and the flow of the prior fabrication stage shown in FIGS. 1A-1E along I-I'.

Figure 2A:
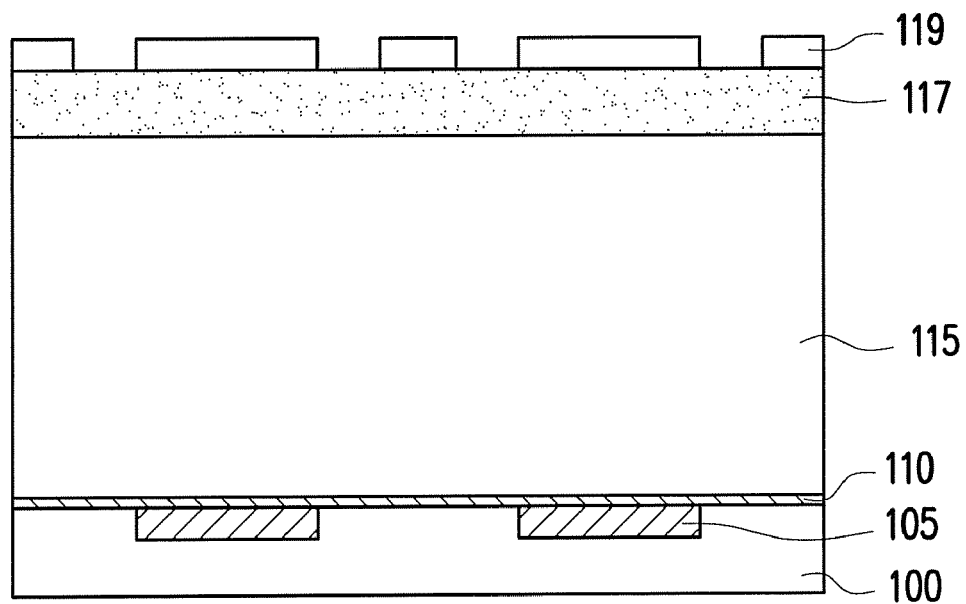
FIGS. 2A-2E are cross-section diagrams of the stacked capacitor structure and the flow of the prior fabrication stage shown in FIGS. 1A-1E along I-I'.

Referring to FIGS. 1A and 2A, a substrate 100 is provided, wherein, for example, a conductive portion 105, and the substrate termed herein includes a wafer and the film layer and the devices, for example, a memory device such as a dynamic random access memory (DRAM), a static random access memory (SRAM), a non-volatile memory or a metal oxide semiconductor transistor (MOS transistor) formed on the substrate 100. An isolation layer 110 can be formed on the substrate 100 to block the upper devices and the lower devices from being conductive with each other. The material of the isolation layer 110 is an insulation material, for example, silicon nitride or silicon nitride. The material of the conductive portion 105 is a conductive material, for example, doped poly silicon or metal, so that the stacked capacitor structure formed in the successive process can be connected to the lower devices.

Next, a mold layer 115 is formed on the substrate 100, and the material of the mold layer 115 includes, for example, boron-phosphor-silicon-glass (BPSG), phosphor-silicon-glass (PSG), spin-on-glass (SOG), undoped silicon glass (USG) or tetraethyl orthosilicate silicon oxide (TEOS silicon oxide). The method of forming the mold layer 115 includes, for example, high-density plasma chemical vapor deposition (HDP CVD), plasma enforced chemical vapor deposition (PECVD) or other chemical vapor depositions.

Next, a hard mask layer 117 is formed on the mold layer 115, and the material of the hard mask layer 117 includes, for example, silicon nitride, silicon nitride oxide, silicon carbide or silicon nitride carbide. The method of forming the hard mask layer 117 hard mask layer 117 is, for example, a chemical vapor deposition (CVD). After that, a patterned photoresist layer 119 is formed on the hard mask layer 117, wherein the patterned photoresist layer 119 includes, for example, positive photoresist, and the method of forming the patterned photoresist layer 119 includes, for example, forming a photoresist material layer (not shown) on the hard mask layer 117 by using spin coating, and then exposing the photoresist material layer to develop the desired pattern to complete the patterned photoresist layer 119.

Referring to the top-view diagram of FIG. 1A, the pattern of the hard mask layer 117 exposed by the patterned photoresist layer 119 is just the pattern of the reinforced structure formed later. In the embodiment of FIG. 1A, the exposed pattern of the hard mask layer 117 has four openings. Certainly, the present invention is not limited to the above-mentioned pattern for the patterned photoresist layer 119. In fact, the pattern of the patterned photoresist layer 119 depends on the design of the reinforced structure formed later, and the pattern of the reinforced structure would be depicted in detail in the hereinafter described fabrication flow.

Figure 1B:
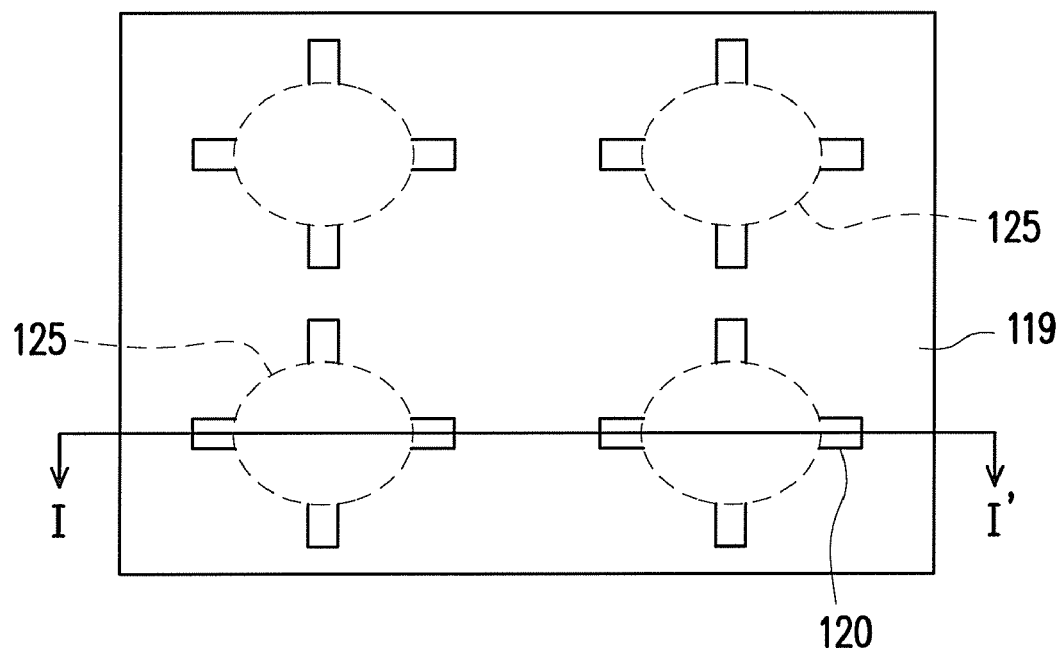
Figure 2B:
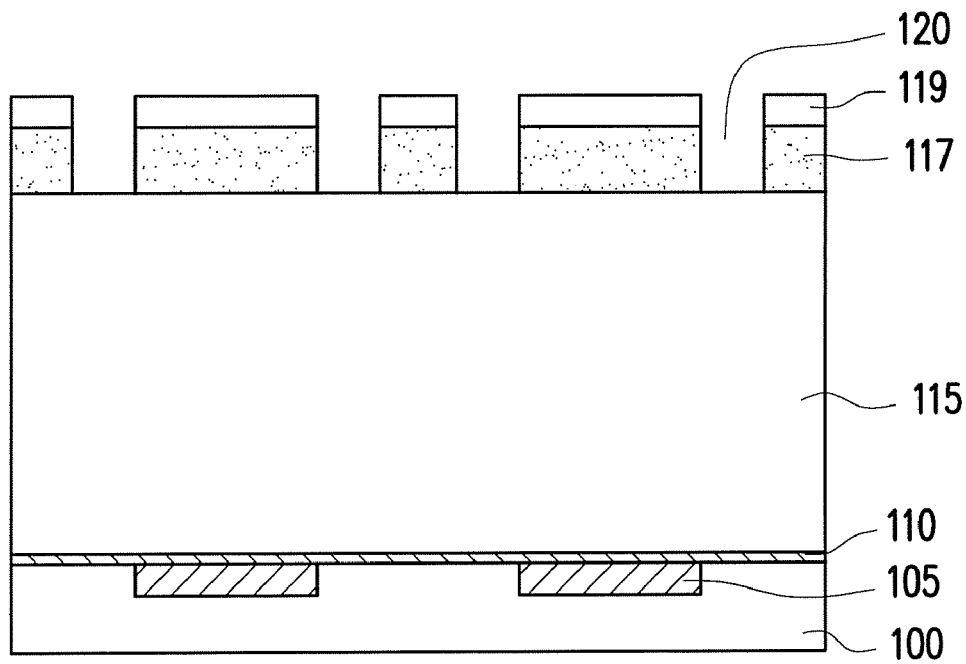

Next, referring to FIGS. 1B and 2B, the patterned photoresist layer 119 serves as a mask to etch the hard mask layer 117 located at a lower position to form a plurality of openings 120, wherein the etching process can be, for example, dry etching such as reactive-ion etching. After that, the patterned photoresist layer 119 is removed by using dry photoresist-removing method or wet photoresist-removing method.

The number of the openings 120 is not restricted, which can be two, four, six or more. The openings 120 are separately distributed around a prism-shape region 125, wherein the sections of the openings 120 can be a square, a circle or other geometric patterns.

In the embodiment, the prism-shape region 125 is the region preserved for forming a lower electrode. As shown in FIG. 1B, there are four rectangular holes 120 arranged at the four ends of a cross, and the openings 120 are separately distributed around the prism-shape region 125. In following, the holes 120 with the above-mentioned arrangement pattern are exemplarily explained to describe the successive fabrication flow.

Figure 1C:
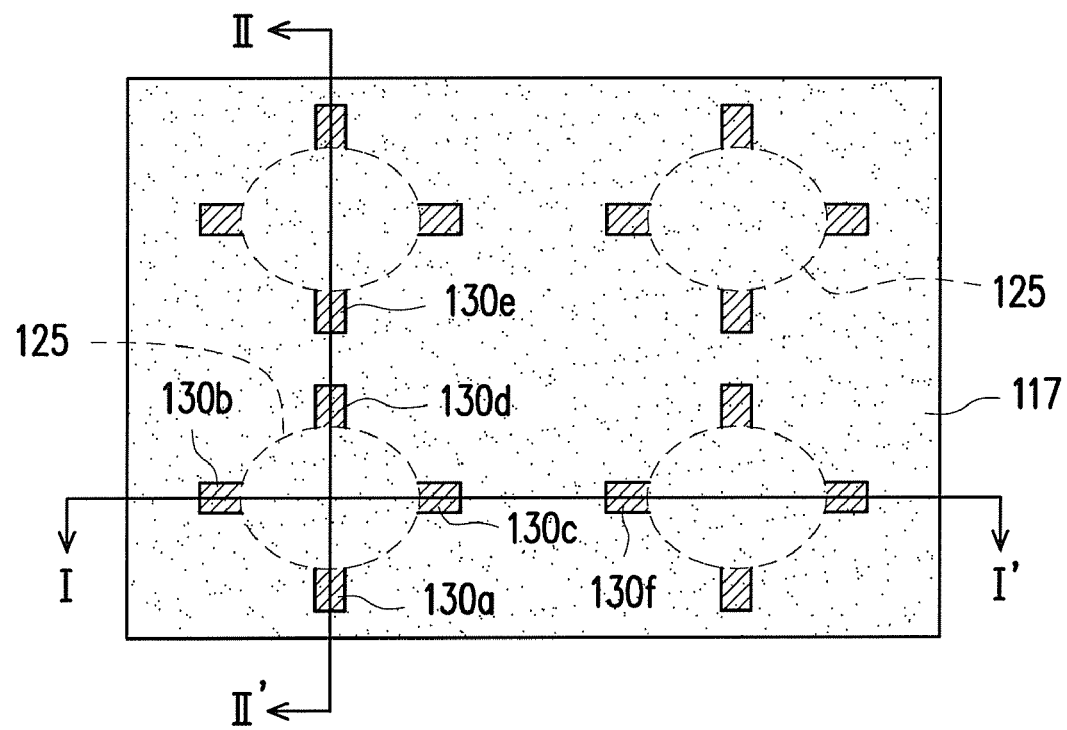
Figure 2C:
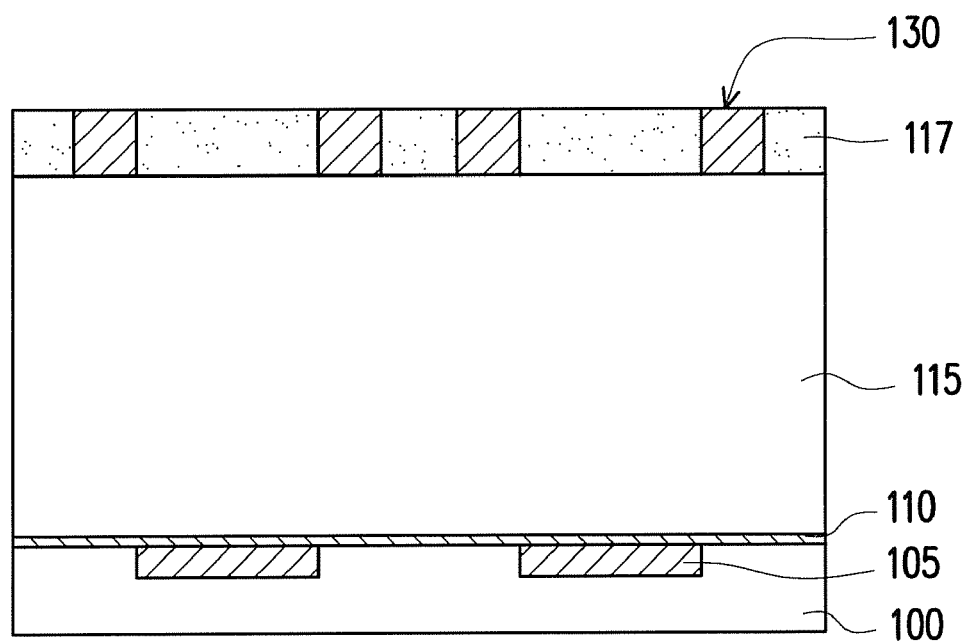

Referring to FIGS. 1C and 2C, a dielectric material is filled into each of the holes 120 to form a reinforced structure 130. The material of the reinforced structure 130 includes a dielectric material, for example, silicon nitride, silicon carbide, silicon oxide, silicon nitride oxide or aluminium oxide, and the method of forming the reinforced structure 130 is, for example, CVD.

The reinforced structures 130 are arranged along the shortest-interval directions between the prism-shape regions 125 (i.e., the I-I' direction and the II-II' direction). In the present embodiment, the reinforced structure 130 comprises, for example, a plurality of separated members 130a, 130b, 130c and 130d, which are scattered around the prism-shape region 125. As indicated before, the holes 120 can have various section patterns, therefore, the formed reinforced structure 130 has a variety of patterns not limited to the pattern of FIG. 1C.

The members 130a, 130b, 130c and 130d of the reinforced structure 130 are independent and separated and do not need connecting members to connect them, so that the space occupied by the reinforced structure 130 is reduced. Meanwhile in FIG. 1C, there are no connecting members between the members 130c and 130d and other members 130e and 130f of the adjacent two reinforced structures (i.e. the two reinforced structures respectively located along the two shortest-interval directions). Instead, there are two intervals between 130c and 130f, and between 130d and 130e, so that an enough filling space between the capacitors exists. In this way, the present invention utilizes reinforced structures 130 with the minimal occupied space to enforce the capacitor structure finished in a successive process would allow the capacitor deflected but without collapse risk, which relatively increases the surface area of the capacitor and thereby the capacitance thereof.

Figure 1D:
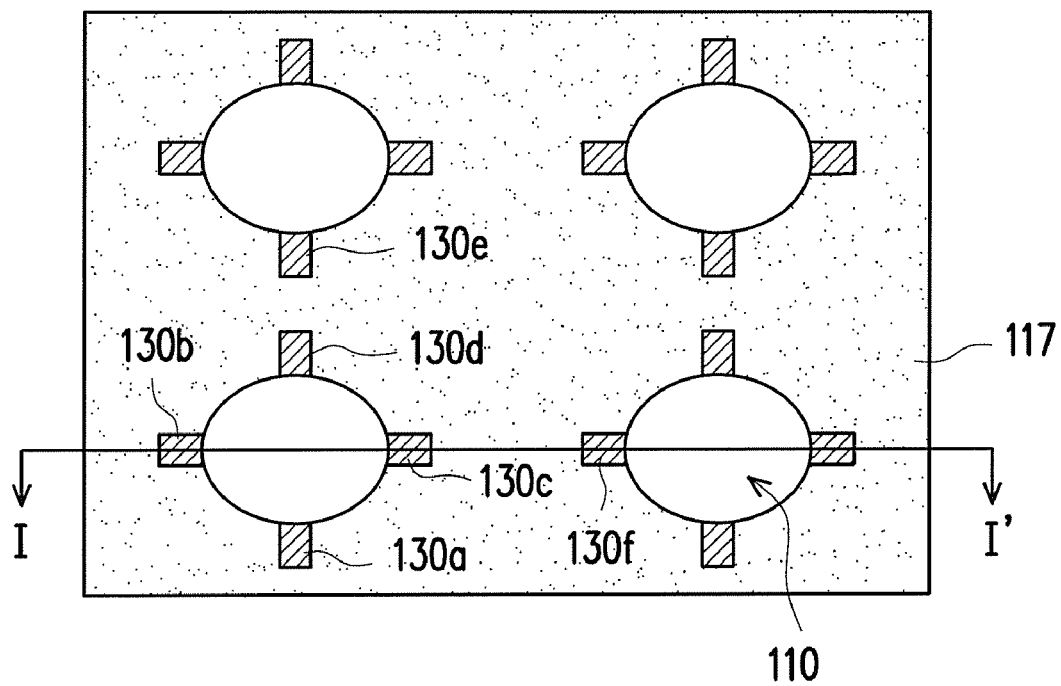
Figure 2D:
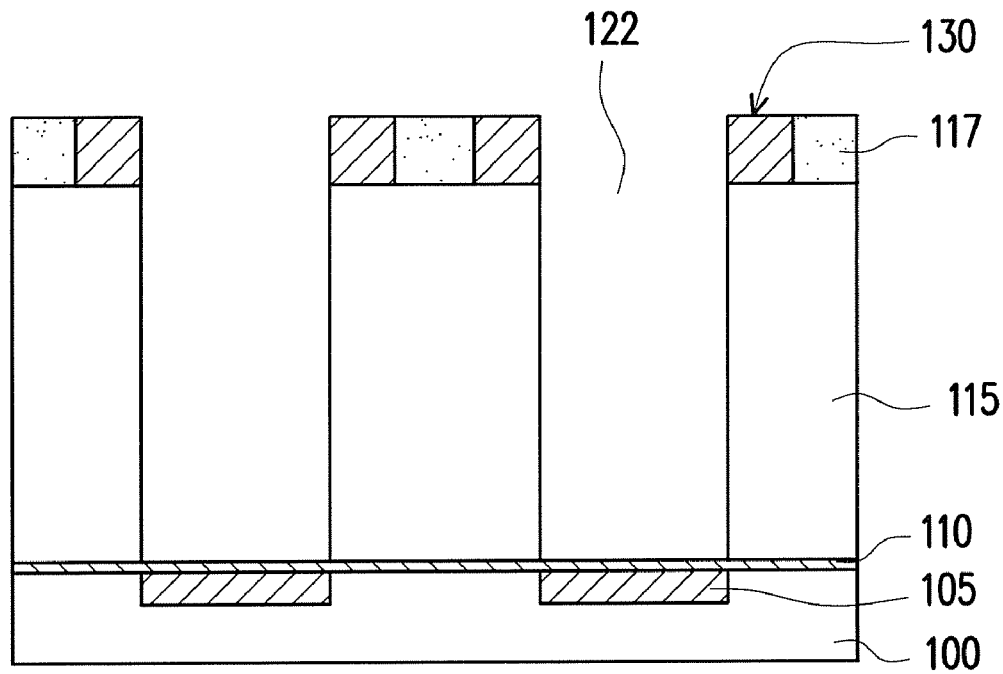

After that, referring to FIGS. 1D and 2D, the patterned hard mask layer 117 and the reinforced structure 130 serve as masks to remove the exposed mold layer 115 and to etch to form an opening 122. Next, the isolation layer 110 at the bottom of the opening 122 is etched so as to expose the conductive portion 105 of the substrate 100. The method of removing a part of the mold layer 115 includes, for example, dry etching such as reactive-ion etching; the method of removing the hard mask layer 117 can be can be dry etching or wet etching.

Figure 1E:
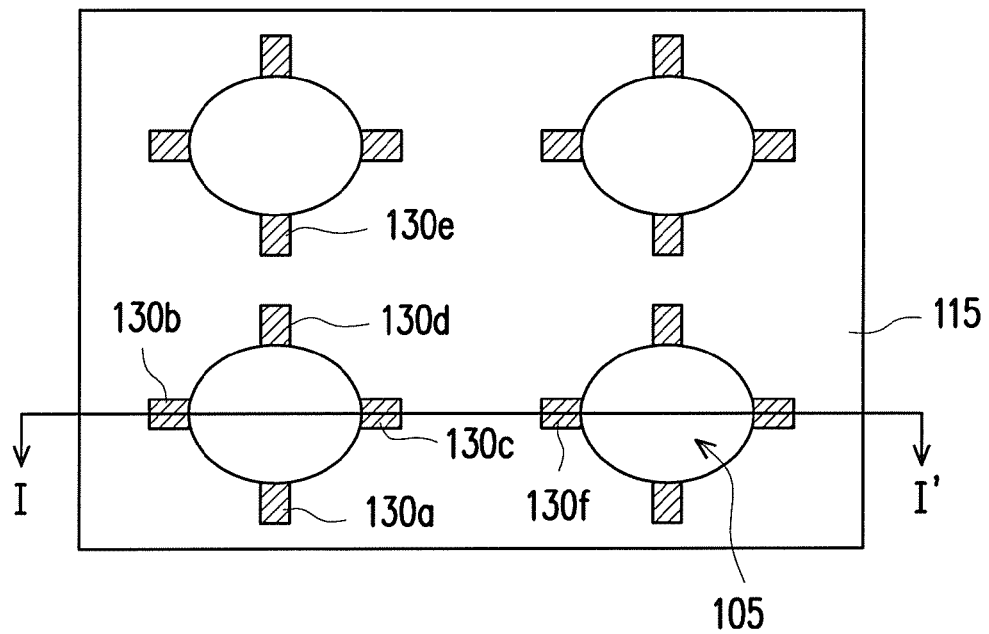
Figure 2E:
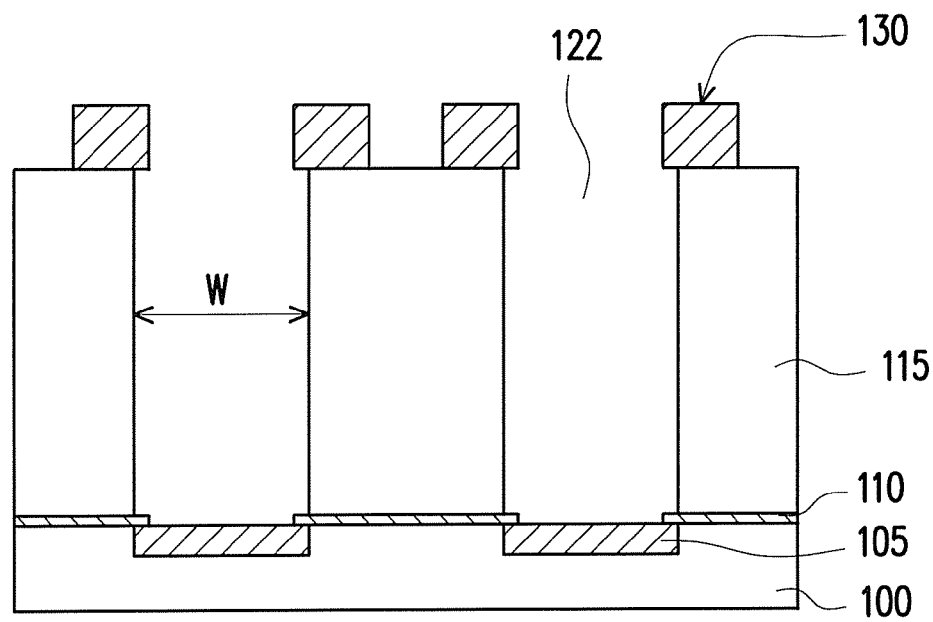
Figures 1, 2F:
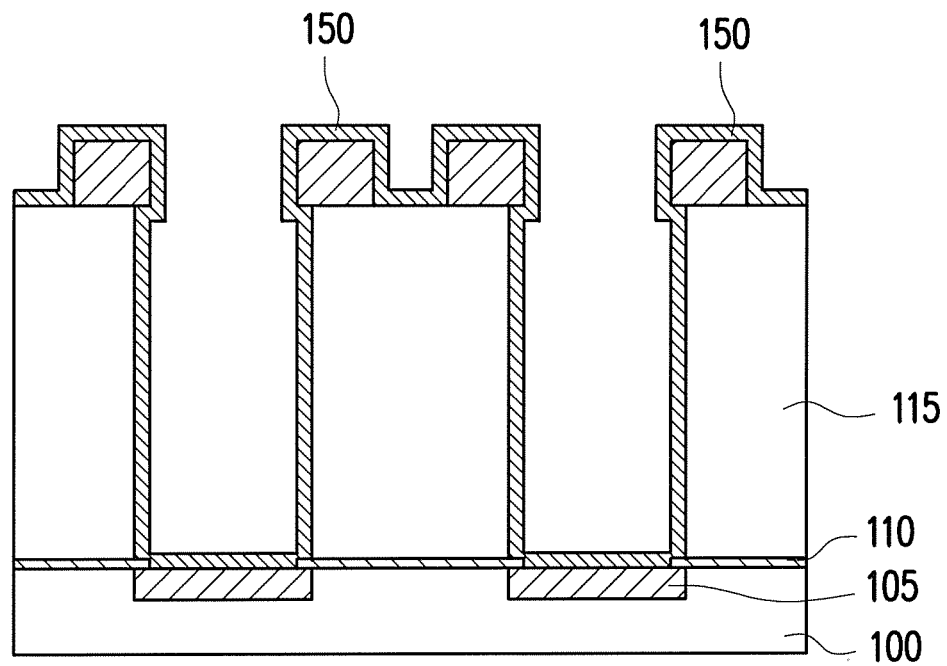
FIGS. 2F-1, 2F-2 and 2F-3 are flow diagrams for forming a lower electrode of the present invention.
Figures 2, 2F:
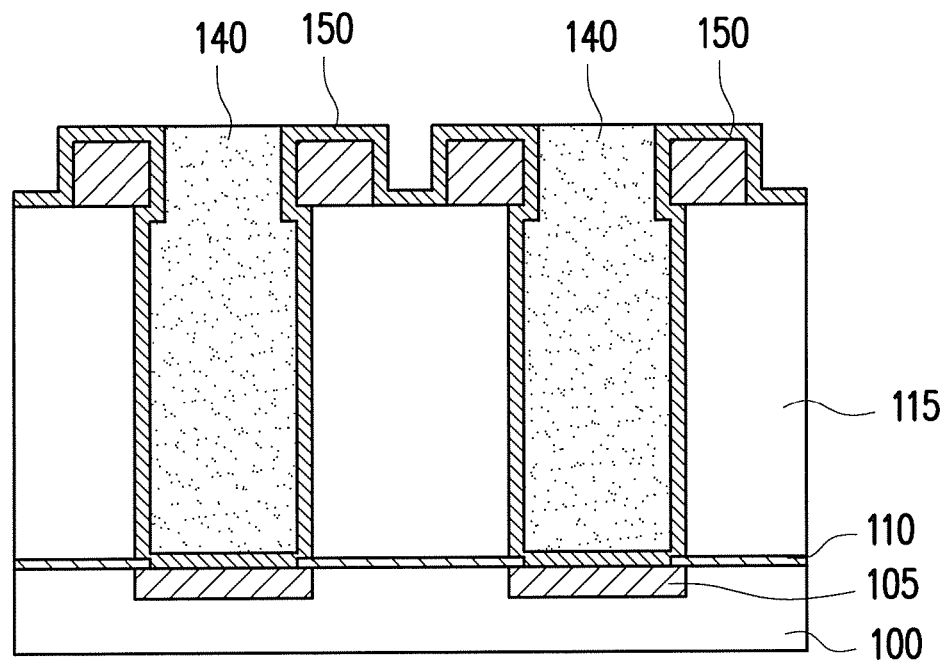

After that, referring to FIGS. 1E and 2E, the opening 122 under the reinforced structure 130 is sideward etched so as to expand the dimension of the opening 122 to W. In the present embodiment, the material of the reinforced structure 130 is preferably a material having an etching selectivity ratio different from that of the mold layer 115, i.e., the etching rate of the reinforced structure 130 is preferably less than that of the mold layer 115, so that the mold layer 115 can be easily removed during the sideward etching and retaining the reinforced structure 130. In another embodiment, however, the lower electrode fabricated in a successive process is directly formed following the architecture of FIGS. 1D and 2D without a sideward etching. In other words, the embodiment of FIGS. 1E and 2E does not limit the present invention.

The flow of fabricating the lower electrode is depicted as follows, however this is not intended to restrict the scope of the present invention. Referring to FIGS. 2F-1, 2F-2 and 2F-3, a co-formed electrode material 150 is formed in the opening 122 and on the mold layer 115. Then, a photoresist material 140 is filled into the opening 122 to cover a part of the electrode material. After that, the part of the electrode material on the mold layer 115 outside the opening 122 is removed so as to form a plurality of separated lower electrodes 150a. The material of the lower electrode 150a can be, for example, polysilicon, doped polysilicon or a material containing metal such as titanium/titanium-nitride, copper. The lower electrode 150a can be, for example, a cup-shaped or a hollow-cylinder-shaped with a bottom. In the embodiment, the lower electrode 150a has, for example but not limited to, a circle-ring-shape section as shown in the top-view diagram (not shown). The lower electrode 150a can be designed to have ellipse-ring-shape section, rectangular section or any other shapes. The lower electrode 150a can be a prism-shaped structure and is not limited to the hollow-prism-shape structure of the embodiment. Besides, the height of the lower electrode 150a is controlled by the height of the mold layer 115.

Figures 2, 2F, 3:
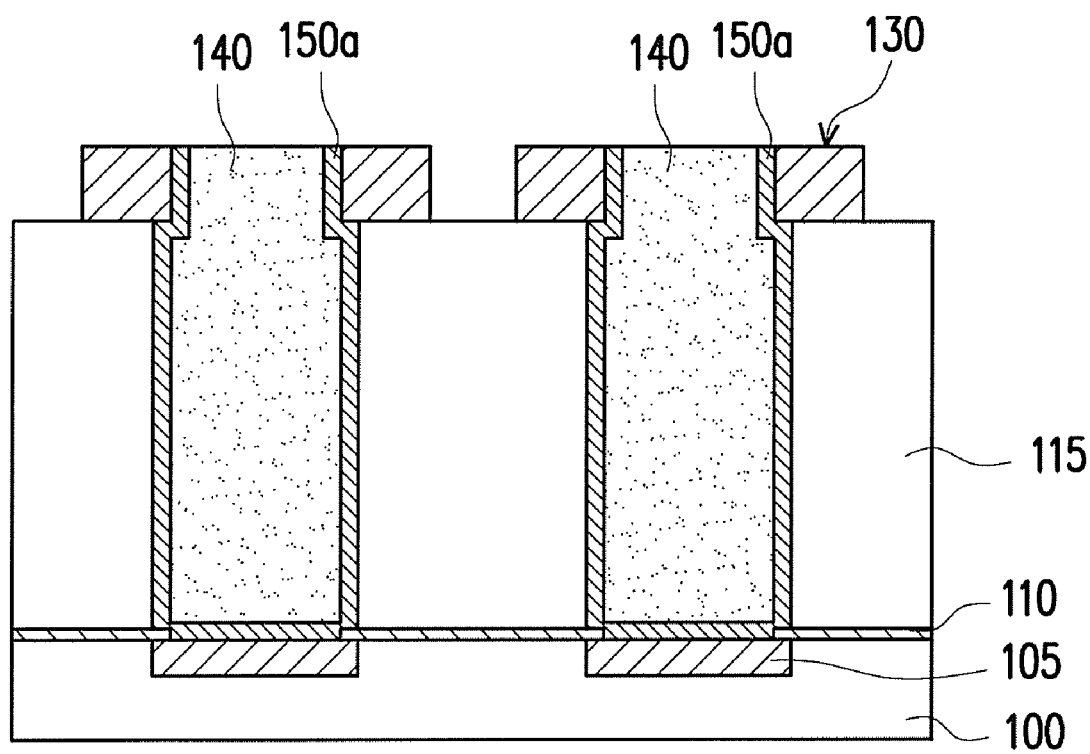
Figure 2G:
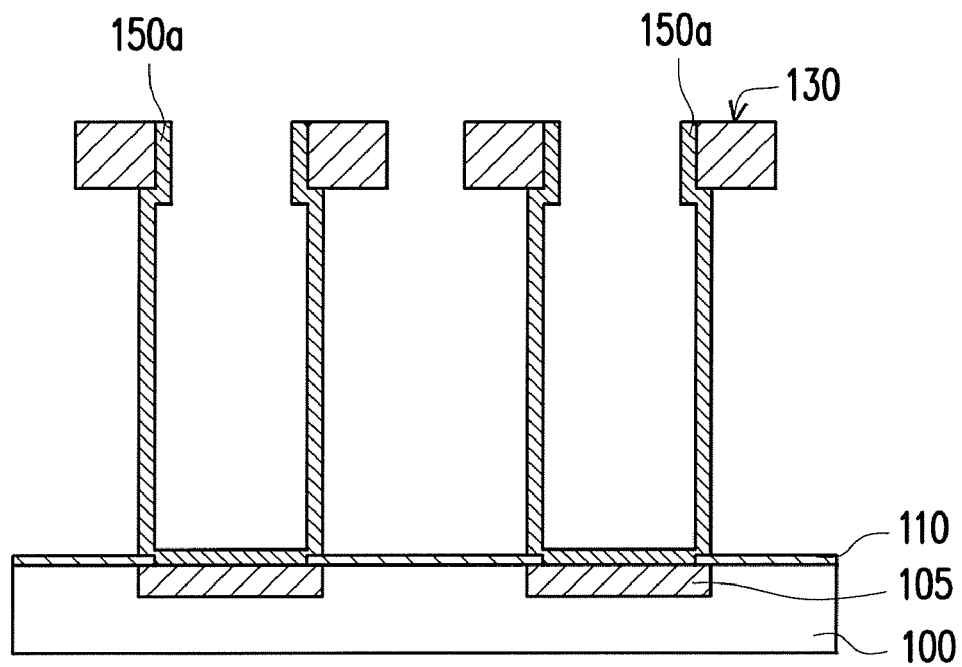
FIGS. 2G-2H are diagrams showing a stacked capacitor structure and the flow of the posterior fabrication stage thereof according to an embodiment of the present invention.

After that, referring to FIG. 2G, the photoresist material 140 and the mold layer 115 are removed by using dry etching or wet etching so as to retain the lower electrode 150a and the reinforced structure 130 disposed at the top of the outer-sidewall of the lower electrode 150a. The 3-D outlook of the above-mentioned lower electrode 150a and reinforced structure 130 is as shown by FIG. 3. Since there are connecting members between the reinforced structures 130, the present invention allows the capacitor structure produce a partial deflection. When an excessive deflection occurs between the adjacent capacitor structures and the capacitors thereof get contacted, the employed reinforced structure 130 still is able to isolate the contacted capacitors and prevent the capacitor from being conductive leading to a failure.

Figure 2H:
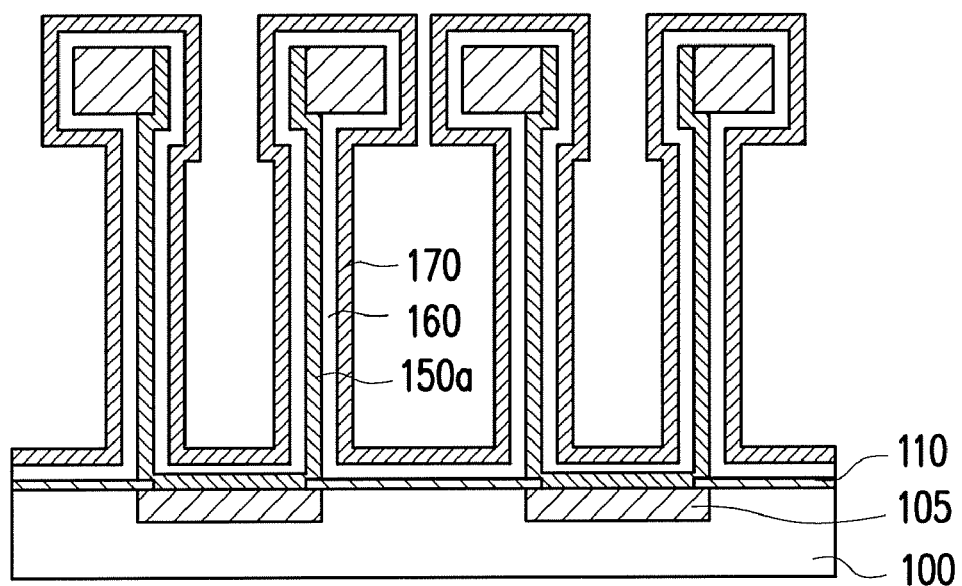
Figure 3:
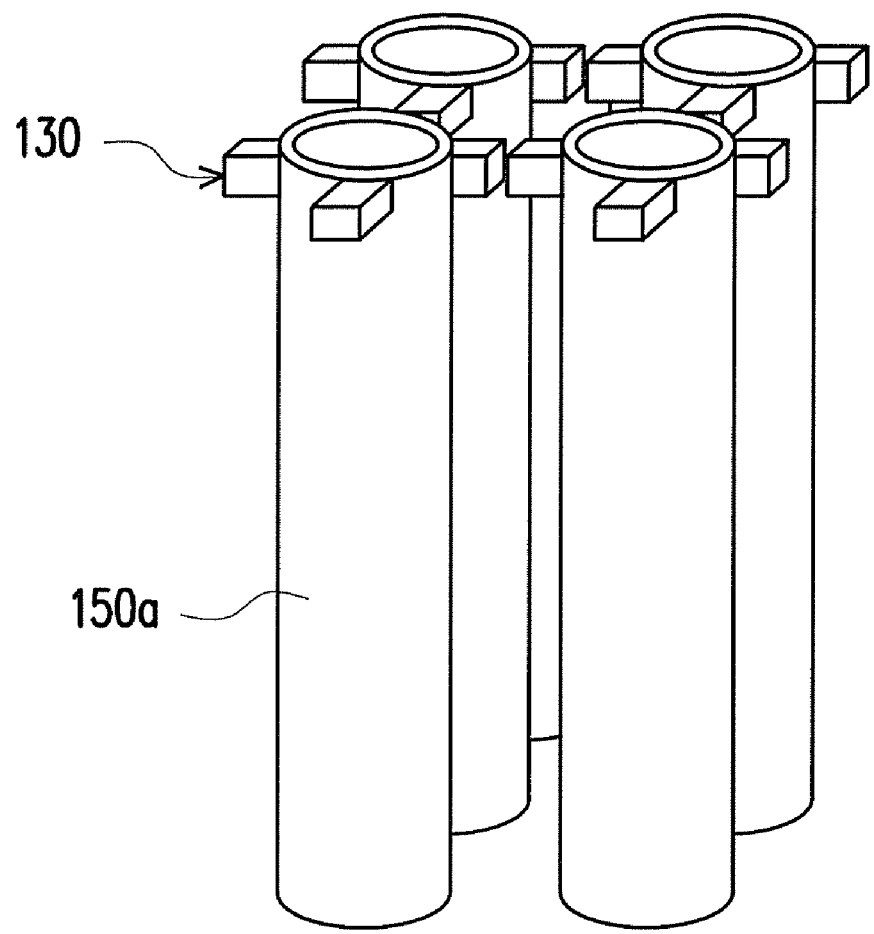

Referring to FIG. 2H, a co-formed dielectric layer 160 is formed on the substrate 100 and along the surface profile of the substrate 100. The formed dielectric layer 160 covers the isolation layer 110, the reinforced structure 130 and the lower electrode 150a. The material of the dielectric layer 160 is, for example, silicon oxide, and the dielectric layer 160 is formed by using, for example, CSD. After that, the upper electrode 170 is formed on the dielectric layer 160, wherein CSD is used to deposit an electrode material on the dielectric layer 160. The material of the electrode material can be, for example, polysilicon, doped polysilicon or a material containing metal such as titanium/titanium nitride, copper, tungsten.

Note that in comparison with the conventional reinforced structure having connecting members, the separated reinforced structures of the present invention make a larger space between the capacitors, which facilitates filling the conductive material between the capacitors, increases the surface area covered by the conductive material and thereby increases capacitance. In the embodiment, the hollow space in the lower electrode 150a is not filled up by the conductive material; but in another embodiment, the hollow space in the lower electrode 150a is filled up by the conductive material.

After forming the upper electrode 170, the fabrication of a stacked capacitor structure is completed, wherein the stacked capacitor structure comprises the upper electrode 170, the dielectric layer 160, the reinforced structure 130 and the lower electrode 150a. The dielectric layer 160 serves as a capacitor dielectric layer in the capacitor structure sandwiched between the lower electrode 150a and the upper electrode 170, wherein a much larger surface area of the inner-and-outer sidewalls of a capacitor is able to provide a sufficient capacitance to meet the demand of miniaturization process.

Figure 4:
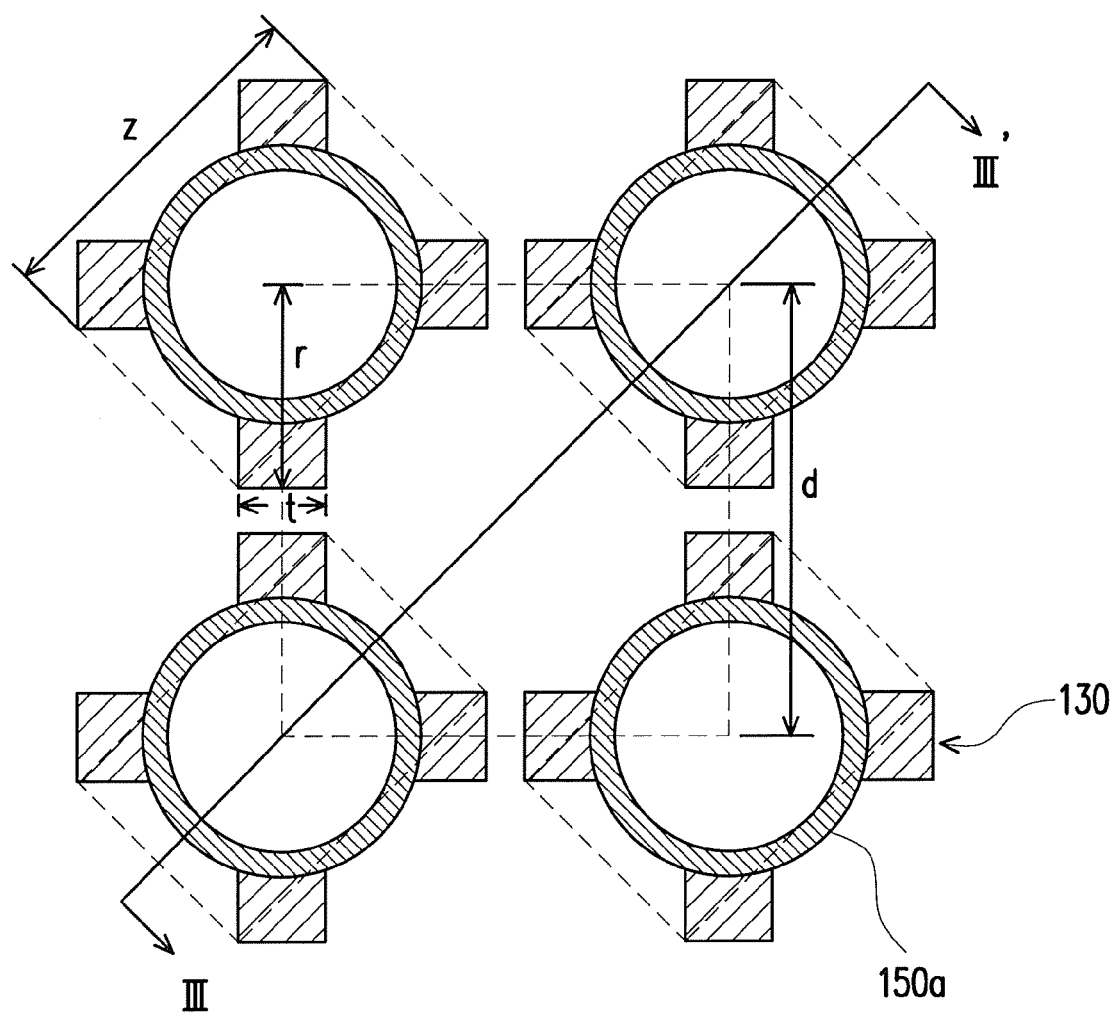
FIG. 4 is a schematic dimension drawing of a stacked capacitor structure design according to an embodiment of the present invention.

Since the reinforced structure 130 in the present invention is located along the two shortest-interval directions between the adjacent capacitors, and there are no connecting members for connecting the reinforced structures 130; therefore, a deflection along the directions of I-I' and II-II' as shown in FIG. 1C is allowed. For a deflection occurs along a diagonal direction can be also treated referring to the dimension design drawing of the capacitor structure in FIG. 4, wherein to prevent two capacitor structures collapsed due to a deflection along a diagonal direction (the III-III' direction), the dimensions are subject to the following relationship:

$$Z > \sqrt{2}d - Z.$$

Z herein is the maximal expanding extent of capacitor structure and the d is the distance between the center of two capacitor structures along the minimal interval direction. When Z is expressed by the maximal radial length r of the capacitor structure and the width t of the separated member, an equation is obtained as follows:

$$Z = \sqrt{2(r+t/2)^2}.$$

And, a relationship can be derived from the above-listed two relationships:

$$r + 0.5t > 0.5d.$$

It can be seen that in designing separated reinforced structures 130, a restraint condition of $r + 0.5t > 0.5d$ must be satisfied so as to prevent the collapse due to a deflection of the capacitors. Although the above-mentioned restraint condition only corresponds to the embodiment of FIG. 3, but in another embodiment, another scheme is adopted, where an additional reinforced structure (not shown) is disposed along the diagonal direction so as to prevent the capacitors collapsed and a capacitor failure is avoided.

In summary, in the stacked capacitor structure of the present invention, separated reinforced structures are disposed at the outer-sidewalls of the lower electrodes thereof, which not only reduces the space occupied by the reinforced structure to increase the surface areas of the upper electrode and the lower electrode of the capacitor, but also allows the capacitor to be deflected but collapse-proof and there are more spaces between the capacitors, so as to resolve the filling difficulty problem due to a too small filling space in a successive process of depositing conductive material into the filling space.

Accordingly, the present invention is directed to a stacked capacitor structure and the manufacturing method thereof. In the stacked capacitor structure, separated reinforced structures are disposed at the outer-sidewalls of the lower electrodes thereof to avoid the capacitor from collapse failure. In the stacked capacitor structure, separated reinforced structures are disposed at a top of a outer-sidewalls of the lower electrodes thereof to reduce the space occupied by the reinforced structures for increasing the surface areas of the upper electrodes and the lower electrodes of the capacitors. In the stacked capacitor structure, separated reinforced structures are disposed at a top of a outer-sidewalls of the lower electrodes thereof to allow the capacitor to be deflected but collapse-proof and there are more spaces between the capacitors, so as to solve the filling difficulty problem due to a too small filling space in a successive process of depositing conductive material into the filling space.

The foregoing description of the preferred embodiment of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A stacked capacitor structure, comprising:
   a lower electrode;
   a dielectric layer, covering the lower electrode;
   an upper electrode, covering the dielectric layer; and
   a reinforced structure, disposed at a top of an outer-sidewall of the lower electrodes and consists of a plurality of separated members, wherein dimensions of the separated members satisfy a restraint condition:

$$r+0.5t>0.5d;$$

wherein r is a maximum radial length of a capacitor structure, t is a width of a separated member and d is a distance between center of two capacitor structures along the minimal interval direction.

2. The stacked capacitor structure according to claim 1, wherein the separated members are separately disposed around the outer-sidewall of the lower electrode.

3. The stacked capacitor structure according to claim 1, wherein the lower electrode has a cylindrical shape.

4. The stacked capacitor structure according to claim 1, wherein the material of the reinforced structure comprises silicon nitride, silicon oxide, silicon nitride oxide or aluminium oxide.

5. The stacked capacitor structure according to claim 1, wherein the materials of the lower electrode and the upper electrode comprise doped polysilicon.

6. The stacked capacitor structure according to claim 1, wherein the stacked capacitor structure is applied in a dynamic random access memory (DRAM).

7. The stacked capacitor structure according to claim 1, wherein the reinforced structure is not connected to an adjacent reinforced structure.

* * * * *